(12) United States Patent
Tanaka (10) Patent No.: US 11,387,156 B2
(45) Date of Patent: Jul. 12, 2022

(54) SILICON CARBIDE SEMICONDUCTOR DEVICE INCLUDING A RESIN COVERING A SILICON CARBIDE SEMICONDUCTOR CHIP

(71) Applicant: Sumitomo Electric Industries, Ltd., Osaka (JP)

(72) Inventor: So Tanaka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/257,938

(22) PCT Filed: May 29, 2019

(86) PCT No.: PCT/JP2019/021292
§ 371 (c)(1),
(2) Date: Jan. 5, 2021

(87) PCT Pub. No.: WO2020/012812
PCT Pub. Date: Jan. 16, 2020

(65) Prior Publication Data
US 2021/0272867 A1 Sep. 2, 2021

(30) Foreign Application Priority Data
Jul. 11, 2018 (JP) .............................. JP2018-131497

(51) Int. Cl.
*H01L 23/31* (2006.01)
*H01L 23/00* (2006.01)
(Continued)

(52) U.S. Cl.
CPC .......... *H01L 23/3114* (2013.01); *H01L 24/32* (2013.01); *H01L 29/0623* (2013.01);
(Continued)

(58) Field of Classification Search
CPC ............ H01L 29/0623; H01L 29/1095; H01L 29/1608; H01L 29/7811; H01L 29/7813;
(Continued)

(56) References Cited

U.S. PATENT DOCUMENTS 9,607,961 B2 * 3/2017 Sato .................... H01L 29/7397
2014/0061871 A1 3/2014 Nagasawa
(Continued)

FOREIGN PATENT DOCUMENTS

JP H11-233738 A 8/1998
JP H11-233738 A 8/1999
(Continued)

*Primary Examiner* — Khiem D Nguyen
(74) *Attorney, Agent, or Firm* — Baker Botts L.L.P.; Michael A. Sartori (57) ABSTRACT

The silicon carbide semiconductor chip includes a silicon carbide substrate, a first insulating film on the silicon carbide substrate, and a second insulating film on the first insulating film. The silicon carbide substrate has a first main surface in contact with the first insulating film, a second main surface, and an outer peripheral surface. The resin covers both of the outer peripheral surface and the second insulating film. The second insulating film has a Young's modulus lower than that of the resin. The second insulating film has a thermal expansion coefficient higher than that of the silicon carbide substrate and higher than that of the resin. The second insulating film includes a first outer peripheral end portion. In a cross section perpendicular to the first main surface, the first outer peripheral end portion is provided along the outer peripheral surface.

5 Claims, 8 Drawing Sheets

(51) Int. Cl.
  *H01L 29/06* (2006.01)
  *H01L 29/10* (2006.01)
  *H01L 29/16* (2006.01)
  *H01L 29/78* (2006.01)

(52) U.S. Cl.
  CPC ...... *H01L 29/1095* (2013.01); *H01L 29/1608* (2013.01); *H01L 29/7811* (2013.01); *H01L 29/7813* (2013.01); *H01L 2224/32245* (2013.01); *H01L 2924/10272* (2013.01); *H01L 2924/13091* (2013.01)

(58) Field of Classification Search
  CPC . H01L 29/66068; H01L 29/739; H01L 29/78; H01L 23/31; H01L 23/3114; H01L 2924/10272; H01L 2924/13091; H01L 21/02378; H01L 23/29
  USPC .......................................................... 257/77
  See application file for complete search history.

(56) References Cited

U.S. PATENT DOCUMENTS

| | | |
|---|---|---|
| 2015/0357405 A1 | 12/2015 | Ueda et al. |
| 2015/0372128 A1 | 12/2015 | Wada et al. |
| 2017/0178989 A1* | 6/2017 | Matocha ............. H01L 29/7811 |
| 2017/0271443 A1 | 9/2017 | Ohara |
| 2019/0371885 A1* | 12/2019 | Mori ....................... H01L 24/48 |
| 2020/0058733 A1* | 2/2020 | Negishi ................... H01L 29/06 |

FOREIGN PATENT DOCUMENTS

| | | |
|---|---|---|
| JP | 2014-049695 A | 3/2014 |
| JP | 2014-139967 A | 7/2014 |
| JP | 2016-015482 A | 1/2016 |
| JP | 2017-168669 A | 9/2017 |
| WO | 2017/199698 A1 | 11/2017 |

* cited by examiner

SILICON CARBIDE SEMICONDUCTOR DEVICE INCLUDING A RESIN COVERING A SILICON CARBIDE SEMICONDUCTOR CHIP

TECHNICAL FIELD

The present disclosure relates to a silicon carbide semiconductor device. The present application claims priority to Japanese Patent Application No. 2018-131497 filed on Jul. 11, 2018, the entire contents of which are incorporated herein by reference.

BACKGROUND ART

Japanese Patent Laying-Open No. 2014-139967 (PTL 1) discloses a trench metal oxide semiconductor field effect transistor (MOSFET).

CITATION LIST

Patent Literature

PTL 1: Japanese Patent Laying-Open No. 2014-139967

SUMMARY OF INVENTION

A silicon carbide semiconductor device according to the present disclosure includes a silicon carbide semiconductor chip, and a resin covering the silicon carbide semiconductor chip. The silicon carbide semiconductor chip includes a silicon carbide substrate, a first insulating film on the silicon carbide substrate, and a second insulating film on the first insulating film. The silicon carbide substrate has a first main surface in contact with the first insulating film, a second main surface opposite to the first main surface, and an outer peripheral surface continuous with each of the first main surface and the second main surface. The resin covers both of the outer peripheral surface and the second insulating film. The second insulating film has a Young's modulus lower than that of the resin. The second insulating film has a thermal expansion coefficient higher than that of the silicon carbide substrate and higher than that of the resin. The second insulating film includes a first outer peripheral end portion in a direction parallel to the first main surface. In a cross section perpendicular to the first main surface, the first outer peripheral end portion is provided along the outer peripheral surface.

A silicon carbide semiconductor device according to the present disclosure includes a silicon carbide semiconductor chip, and a resin covering the silicon carbide semiconductor chip. The silicon carbide semiconductor chip includes a silicon carbide substrate, a first insulating film on the silicon carbide substrate, and a second insulating film on the first insulating film. The silicon carbide substrate has a first main surface in contact with the first insulating film, a second main surface opposite to the first main surface, and an outer peripheral surface continuous with each of the first main surface and the second main surface. The resin covers both of the outer peripheral surface and the second insulating film. The second insulating film has a Young's modulus lower than that of the resin. The second insulating film has a thermal expansion coefficient higher than that of the silicon carbide substrate and higher than that of the resin. The second insulating film includes a first outer peripheral end portion in a direction parallel to the first main surface, and an angular shoulder continuous with the first outer peripheral end portion. In a cross section perpendicular to the first main surface, the first outer peripheral end portion is provided along the outer peripheral surface. The resin is in contact with the shoulder. The first insulating film includes a second outer peripheral end portion in the direction parallel to the first main surface. In the cross section perpendicular to the first main surface, the second outer peripheral end portion is provided along the outer peripheral surface. The first insulating film includes a first annular portion, and a second annular portion spaced from and surrounding the first annular portion. The second insulating film includes a filling portion provided between the first annular portion and the second annular portion. The filling portion is in contact with the silicon carbide substrate.

DETAILED DESCRIPTION

Overview of Embodiment of the Present Disclosure

An overview of an embodiment of the present disclosure is initially provided. Regarding crystallographic denotation herein, an individual orientation, a group orientation, an individual plane, and a group plane are shown in [ ], < >, ( ), and { }, respectively. A crystallographically negative index is normally expressed by a number with a bar "-" thereabove, however, a negative sign herein precedes a number.

(1) A silicon carbide semiconductor device 100 according to the present disclosure includes a silicon carbide semiconductor chip 30, and a resin 8 covering silicon carbide semiconductor chip 30. Silicon carbide semiconductor chip 30 includes a silicon carbide substrate 10, a first insulating film 60 on silicon carbide substrate 10, and a second insulating film 70 on first insulating film 60. Silicon carbide substrate 10 has a first main surface 1 in contact with first insulating film 60, a second main surface 2 opposite to first main surface 1, and an outer peripheral surface 3 continuous with each of first main surface 1 and second main surface 2. Resin 8 covers both of outer peripheral surface 3 and second insulating film 70. Second insulating film 70 has a Young's modulus lower than that of resin 8. Second insulating film 70 has a thermal expansion coefficient higher than that of silicon carbide substrate 10 and higher than that of resin 8. Second insulating film 70 includes a first outer peripheral end portion 72 in a direction parallel to first main surface 1.

In a cross section perpendicular to first main surface 1, first outer peripheral end portion 72 is provided along outer peripheral surface 3.

(2) In silicon carbide semiconductor device 100 according to (1), second insulating film 70 may include an angular shoulder 71 continuous with first outer peripheral end portion 72. Resin 8 may be in contact with shoulder 71.

(3) In silicon carbide semiconductor device 100 according to (1) or (2), first insulating film 60 may include a second outer peripheral end portion 67 in the direction parallel to first main surface 1. In the cross section perpendicular to first main surface 1, second outer peripheral end portion 67 may be provided along outer peripheral surface 3.

(4) In silicon carbide semiconductor device 100 according to any one of (1) to (3), first insulating film 60 may include a first annular portion 61, and a second annular portion 62 spaced from and surrounding first annular portion 61.

(5) In silicon carbide semiconductor device 100 according to (4), second insulating film 70 may include a filling portion 76 provided between first annular portion 61 and second annular portion 62. Filling portion 76 may be in contact with silicon carbide substrate 10.

(6) A silicon carbide semiconductor device 100 according to the present disclosure includes a silicon carbide semiconductor chip 30, and a resin 8 covering silicon carbide semiconductor chip 30. Silicon carbide semiconductor chip 30 includes a silicon carbide substrate 10, a first insulating film 60 on silicon carbide substrate 10, and a second insulating film 70 on first insulating film 60. Silicon carbide substrate 10 has a first main surface 1 in contact with first insulating film 60, a second main surface 2 opposite to first main surface 1, and an outer peripheral surface 3 continuous with each of first main surface 1 and second main surface 2. Resin 8 covers both of outer peripheral surface 3 and second insulating film 70. Second insulating film 70 has a Young's modulus lower than that of resin 8. Second insulating film 70 has a thermal expansion coefficient higher than that of silicon carbide substrate 10 and higher than that of resin 8. Second insulating film 70 includes a first outer peripheral end portion 72 in a direction parallel to first main surface 1, and an angular shoulder 71 continuous with first outer peripheral end portion 72. In a cross section perpendicular to first main surface 1, first outer peripheral end portion 72 is provided along outer peripheral surface 3. Resin 8 is in contact with shoulder 71. First insulating film 60 includes a second outer peripheral end portion 67 in the direction parallel to first main surface 1. In the cross section perpendicular to first main surface 1, second outer peripheral end portion 67 is provided along outer peripheral surface 3. First insulating film 60 includes a first annular portion 61, and a second annular portion 62 spaced from and surrounding first annular portion 61. Second insulating film 70 includes a filling portion 76 provided between first annular portion 61 and second annular portion 62. Filling portion 76 is in contact with silicon carbide substrate 10.

Details of Embodiment of the Present Disclosure

The embodiment is described below based on the drawings. Note that the same or corresponding elements in the drawings below are designated by the same reference numbers and will not be described repeatedly.

First, the configuration of a silicon carbide semiconductor device 100 according to the present embodiment is described.

Figure 1:
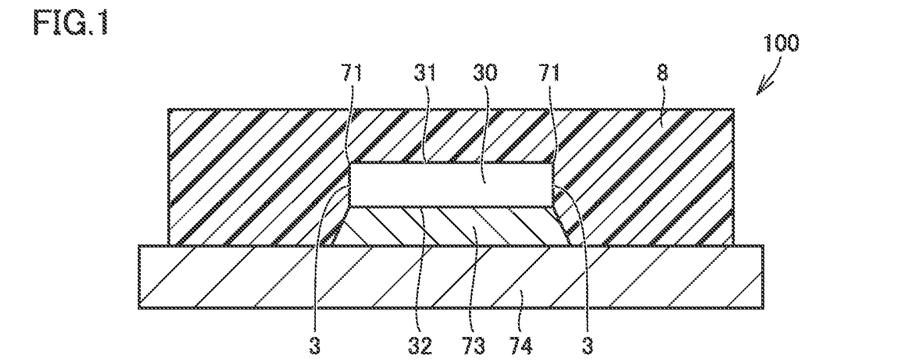
FIG. 1 is a schematic vertical sectional view showing the configuration of a silicon carbide semiconductor device according to the present embodiment.

As shown in FIG. 1, silicon carbide semiconductor device 100 according to the present embodiment mainly includes a silicon carbide semiconductor chip 30, a resin 8, a metal frame 74, and a solder layer 73. Metal frame 74 is a copper frame, for example. This copper frame may be plated with nickel. Silicon carbide semiconductor chip 30 is provided on metal frame 74 with solder layer 73 interposed therebetween. From a different viewpoint, solder layer 73 is located between silicon carbide semiconductor chip 30 and metal frame 74. Resin 8 covers silicon carbide semiconductor chip 30 and solder layer 73.

Silicon carbide semiconductor chip 30 has a third main surface 31 and a fourth main surface 32. Fourth main surface 32 is opposite to third main surface 31. Silicon carbide semiconductor chip 30 is in contact with solder layer 73 at fourth main surface 32. Resin 8 covers third main surface 31 of silicon carbide semiconductor chip 30. Resin 8 is in contact with solder layer 73 and metal frame 74. A current and the like are supplied to silicon carbide semiconductor chip 30 through a not-shown wire and the like.

Figure 2:
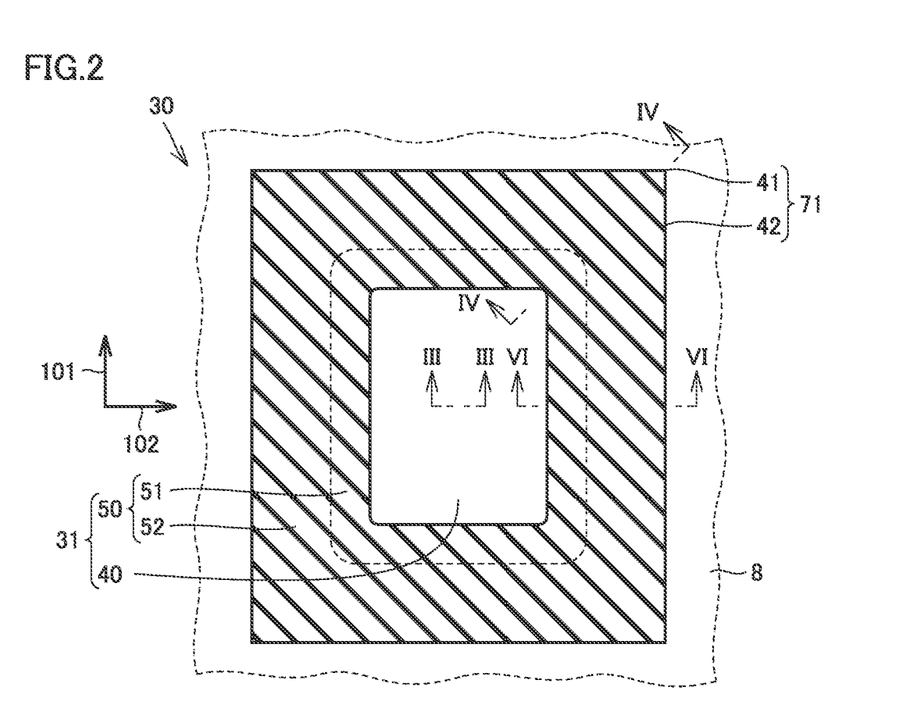
FIG. 2 is a schematic transverse sectional view taken along a line II-II in FIG. 4.

FIG. 2 is a schematic plan view showing the configuration of silicon carbide semiconductor chip 30. As shown in FIG. 2, silicon carbide semiconductor chip 30 includes an active region 40 and an outer peripheral region 50. As shown in FIG. 2, when viewed in a direction perpendicular to a first main surface 1, outer peripheral region 50 surrounds active region 40. Outer peripheral region 50 includes a first outer peripheral region portion 51 and a second outer peripheral region portion 52. First outer peripheral region portion 51 is in contact with active region 40. Second outer peripheral region portion 52 is located at an outer side of first outer peripheral region portion 51. A shoulder 71 of silicon carbide semiconductor chip 30 includes a corner region 41 and a side region 42.

Second outer peripheral region portion 52 surrounds first outer peripheral region portion 51. Second outer peripheral region portion 52 forms shoulder 71. For example, guard rings 16 (see FIG. 4) are provided in first outer peripheral region portion 51. Guard rings 16 surround active region 40.

Figure 3:
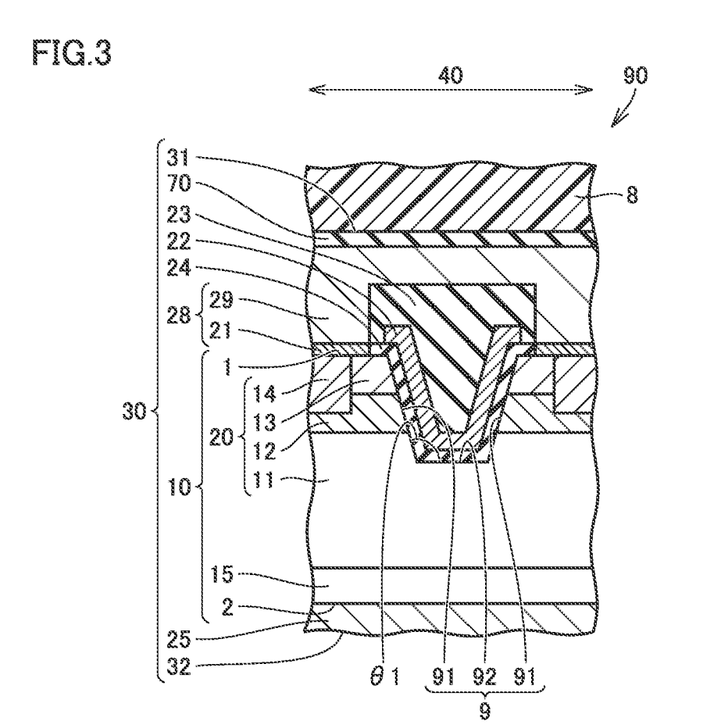
FIG. 3 is a schematic vertical sectional view taken along a line in FIG. 2.

FIG. 3 is a schematic sectional view taken along a line in FIG. 2. As shown in FIG. 3, a silicon carbide semiconductor element 90 is provided in active region 40. Silicon carbide semiconductor element 90 is a MOSFET, for example. Silicon carbide semiconductor element 90 includes a silicon carbide substrate 10, a gate insulating film 24, a gate electrode 22, an interlayer insulating film 23, a source electrode 28, a drain electrode 25, a first insulating film 60 (see FIG. 4), and a second insulating film 70 (see FIG. 4). Note that FIG. 2 illustrates only silicon carbide substrate 10 and second insulating film 70, and does not illustrate gate insulating film 24, gate electrode 22, interlayer insulating film 23, source electrode 28, drain electrode 25, and first insulating film 60.

As shown in FIG. 3, silicon carbide substrate 10 has a first main surface 1, a second main surface 2, and an outer peripheral surface 3. Second main surface 2 is opposite to first main surface 1. Outer peripheral surface 3 is continuous with each of first main surface 1 and second main surface 2. Silicon carbide substrate 10 includes a silicon carbide single-crystal substrate 15, and a silicon carbide epitaxial layer 20 on silicon carbide single-crystal substrate 15. Silicon carbide epitaxial layer 20 forms first main surface 1. Silicon carbide single-crystal substrate 15 forms second main surface 2. Silicon carbide single-crystal substrate 15 and silicon carbide epitaxial layer 20 are made of hexagonal silicon carbide having a polytype of 4H, for example. Silicon carbide single-crystal substrate 15 includes an n type impurity such as nitrogen (N) and has n type (first conductivity type).

First main surface 1 is a {0001} plane, or a surface inclined at an off angle of not more than 8° in an off direction relative to the {0001} plane, for example. First main surface 1 may be a (000-1) plane or a (0001) plane, for example. First main surface 1 may be a surface inclined at an off angle of not more than 8° in an off direction relative to the (000-1) plane, or a surface inclined at an off angle of not more than 8° in an off direction relative to the (0001) plane, for example. The off direction may be a <11-20> direction or a <1-100> direction, for example. The off angle may be not less than 1°, or not less than 2°, for example. The off angle may be not more than 6°, or not more than 4°.

As shown in FIG. 2, when first main surface 1 is the {0001} plane, a first direction 101 is the <11-20> direction, for example. When first main surface 1 is inclined relative to the {0001} plane, first direction 101 is a direction defined by projecting the <11-20> direction on first main surface 1. Similarly, when first main surface 1 is the {0001} plane, a second direction 102 is the <1-100> direction, for example. When first main surface 1 is inclined relative to the {0001} plane, second direction 102 is a direction defined by projecting the <1-100> direction on first main surface 1. Third main surface 31 extends in each of first direction 101 and second direction 102.

As shown in FIG. 3, silicon carbide epitaxial layer 20 mainly includes a drift region 11, a body region 12, a source region 13, and a contact region 14. Drift region 11 is provided on silicon carbide single-crystal substrate 15. Drift region 11 includes an n type impurity such as nitrogen, and has n type conductivity. A concentration of the n type impurity included in drift region 11 may be lower than a concentration of the n type impurity included in silicon carbide single-crystal substrate 15.

Body region 12 is provided on drift region 11. Body region 12 includes a p type impurity such as aluminum (Al), and has p type conductivity (second conductivity type). A concentration of the p type impurity in body region 12 may be higher than the concentration of the n type impurity in drift region 11. Body region 12 is spaced from each of first main surface 1 and second main surface 2.

Source region 13 is provided on body region 12 so as to be separated from drift region 11 by body region 12. Source region 13 includes an n type impurity such as nitrogen or phosphorus (P), and has n type conductivity. Source region 13 forms first main surface 1. A concentration of the n type impurity in source region 13 may be higher than the concentration of the p type impurity in body region 12. The concentration of the n type impurity in source region 13 is about $1 \times 10^{19}$ cm$^{-3}$, for example.

Contact region 14 includes a p type impurity such as aluminum, and has p type conductivity. A concentration of the p type impurity in contact region 14 may be higher than the concentration of the p type impurity in body region 12. Contact region 14 extends through source region 13 and is in contact with body region 12. Contact region 14 forms first main surface 1. The concentration of the p type impurity in contact region 14 is not less than $1 \times 10^{18}$ cm$^{-3}$ and not more than $1 \times 10^{20}$ cm$^{-3}$, for example.

As shown in FIG. 3, first main surface 1 is provided with a gate trench 9. Gate trench 9 is formed by a sidewall surface 91 and a bottom 92. Sidewall surface 91 is continuous with first main surface 1. Bottom 92 is continuous with sidewall surface 91. Sidewall surface 91 extends through source region 13 and body region 12 to reach drift region 11. From a different viewpoint, sidewall surface 91 is formed by source region 13, body region 12 and drift region 11. Bottom 92 is in drift region 11. From a different viewpoint, bottom 92 is formed by drift region 11. Bottom 92 is a plane surface parallel to second main surface 2, for example. An angle θ1 formed between sidewall surface 91 and bottom 92 is not less than 115° and not more than 135°, for example. Angle θ1 may be not less than 120°, for example. Angle θ1 may be not more than 130°, for example.

Gate insulating film 24 is an oxide film, for example. Gate insulating film 24 is made of a material including silicon dioxide, for example. Gate insulating film 24 is in contact with each of sidewall surface 91 and bottom 92 of gate trench 9. Gate insulating film 24 is in contact with drift region 11 at bottom 92. Gate insulating film 24 is in contact with source region 13, body region 12 and drift region 11 at sidewall surface 91. Gate insulating film 24 may be in contact with source region 13 at first main surface 1.

Gate electrode 22 is provided on gate insulating film 24. Gate electrode 22 is made of polysilicon including a conductive impurity, for example. Gate electrode 22 is disposed within gate trench 9. Gate electrode 22 faces drift region 11, body region 12 and source region 13.

Source electrode 28 is in contact with first main surface 1. Source electrode 28 includes a contact electrode 21 and a source wire 29. Source wire 29 is provided on contact electrode 21. Contact electrode 21 is in contact with source region 13 at first main surface 1. Contact electrode 21 may be in contact with contact region 14 at first main surface 1. Contact electrode 21 is made of a material including Ti (titanium), Al (aluminum) and Si (silicon), for example. Contact electrode 21 is in ohmic contact with source region 13. Contact electrode 21 may be in ohmic contact with contact region 14.

Drain electrode 25 is in contact with second main surface 2. Drain electrode 25 is in contact with silicon carbide single-crystal substrate 15 at second main surface 2. Drain electrode 25 is electrically connected to drift region 11. Drain electrode 25 is made of a material including NiSi (nickel silicon) or TiAlSi (titanium aluminum silicon), for example.

Interlayer insulating film 23 is provided in contact with each of gate electrode 22 and gate insulating film 24. Interlayer insulating film 23 is made of a material including silicon dioxide, for example. Interlayer insulating film 23 electrically insulates gate electrode 22 from source electrode 28. Interlayer insulating film 23 may be partially provided within gate trench 9. Source wire 29 may cover interlayer insulating film 23. Source wire 29 is made of a material including Al, for example.

Figure 4:
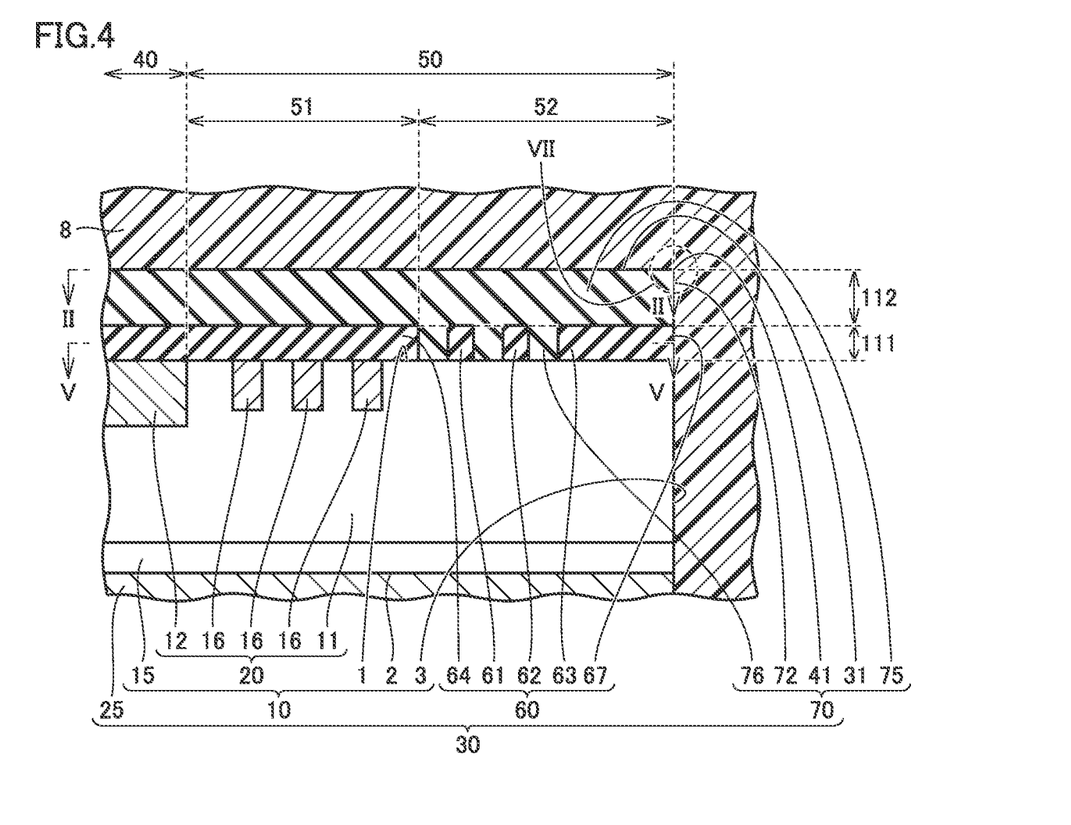
FIG. 4 is a schematic vertical sectional view taken along a line IV-IV in FIG. 2.

FIG. 4 is a schematic sectional view taken along a line Iv-Iv in FIG. 2. As shown in FIG. 2, line IV-IV is a straight line along a diagonal line of silicon carbide semiconductor chip 30 when viewed in the direction perpendicular to first main surface 1. As shown in FIG. 4, first main surface 1 of silicon carbide substrate 10 is in contact with first insulating film 60. In outer peripheral region 50, silicon carbide substrate 10 includes guard rings 16 and drift region 11. Guard rings 16 include a p type impurity such as aluminum (Al) or boron (B), and have p type (second conductivity type). Drift region 11 in outer peripheral region 50 is continuous with drift region 11 in active region 40. In the cross section shown in FIG. 4, second outer peripheral region portion 52 has a width of not more than 20 μm, for example. Guard rings 16 are located closer to the outer periphery than body region 12.

First insulating film 60 is provided on first main surface 1. First insulating film 60 is in contact with each of body region 12 and guard rings 16 at first main surface 1. First insulating film 60 is made of a material including silicon dioxide, for example. Second insulating film 70 is provided on first insulating film 60. Second insulating film 70 is made of a material including polyimide, for example. Second insulating film 70 may be made of a material including polyetherimide or polybenzoxazole, for example. Second insulating film 70 forms third main surface 31. Second insulating film 70 may be provided on source wire 29 (see FIG. 3). Second insulating film 70 may cover gate trench 9.

Second insulating film 70 includes a first outer peripheral end portion 72 in a direction parallel to first main surface 1. As shown in FIG. 4, in the cross section perpendicular to first main surface 1, first outer peripheral end portion 72 is provided along outer peripheral surface 3. Specifically, in the cross section shown in FIG. 4, a distance between first outer peripheral end portion 72 and outer peripheral surface 3 in the direction parallel to first main surface 1 is not more than 20 μm. This distance is more desirably not more than 10 μm, and still more desirably not more than 5 μm. First insulating film 60 includes a second outer peripheral end portion 67 in the direction parallel to first main surface 1. As shown in FIG. 4, in the cross section perpendicular to first main surface 1, second outer peripheral end portion 67 may be provided along outer peripheral surface 3. Specifically, in the cross section shown in FIG. 4, a distance between second outer peripheral end portion 67 and outer peripheral surface 3 in the direction parallel to first main surface 1 is not more than 20 μm. This distance is more desirably not more than 10 μm, and still more desirably not more than 5 μm.

As shown in FIG. 4, resin 8 covers both of outer peripheral surface 3 and second insulating film 70. Resin 8 may cover first insulating film 60. Resin 8 is in contact with each of first insulating film 60, second insulating film 70 and outer peripheral surface 3. Resin 8 is in contact with first insulating film 60 at second outer peripheral end portion 67. Resin 8 is in contact with second insulating film 70 at each of first outer peripheral end portion 72 and third main surface 31. Resin 8 covers each of active region 40 and outer peripheral region 50.

As shown in FIG. 4, resin 8 is in contact with corner region 41 of shoulder 71 (see FIG. 2). Resin 8 may be in contact with drift region 11 at outer peripheral surface 3. Resin 8 may be in contact with silicon carbide single-crystal substrate 15. Resin 8 may be in contact with drain electrode 25. Resin 8 is for sealing silicon carbide semiconductor chip 30. Resin 8 is an epoxy resin, for example. Resin 8 may be a heat-resistant organic resin such as a phenol resin or a maleimide resin, or a resin having inorganic nanoparticules uniformly monodispersed in a polymer component (nanocomposite resin), or the like.

Second insulating film 70 has a Young's modulus lower than that of resin 8. A difference between the Young's modulus of resin 8 and the Young's modulus of second insulating film 70 is smaller than a difference between the Young's modulus of resin 8 and a Young's modulus of silicon carbide substrate 10. Second insulating film 70 has a thermal expansion coefficient higher than that of silicon carbide substrate 10 and higher than that of resin 8. The thermal expansion coefficient as used herein refers to a linear expansion rate. With second insulating film 70 provided between silicon carbide substrate 10 and resin 8, stress on resin 8 can be reduced as compared to when silicon carbide substrate 10 and resin 8 are directly in contact with each other. That is, the second insulating layer functions as a stress buffer layer. Thus, detachment of resin 8 can be suppressed.

TABLE 1

| Material | Young's modulus [MPa] | Thermal expansion coefficient [1/° C.] |
| --- | --- | --- |
| Copper | 117000 | $1.7 \times 10^{-5}$ |
| Silicon carbide | 450000 | $0.277 \times 10^{-5}$ |
| Silica particle-filled epoxy | 15500 | $1.45 \times 10^{-5}$ |
| Polyimide | 2400 | $5 \times 10^{-5}$ |

Table 1 shows a Young's modulus and a thermal expansion coefficient (linear expansion rate) of each material. As shown in Table 1, polyimide (second insulating film 70) has a Young's modulus lower than that of silicon carbide. Polyimide (second insulating film 70) has a Young's modulus lower than that of silica resin-filled epoxy (resin 8). Polyimide (second insulating film 70) has a thermal expansion coefficient higher than that of silicon carbide. Polyimide (second insulating film 70) has a thermal expansion coefficient higher than that of silica resin-filled epoxy (resin 8). Copper (metal frame) has a Young's modulus higher than that of silica resin-filled epoxy (resin 8). Copper (metal frame) generally has a thermal expansion coefficient lower than that of epoxy (resin 8); however, it is also common to adjust the thermal expansion coefficient by the type of resin added to the epoxy, or by the ratio of a filler. The silica particles have a filling ratio of not less than 80% and not more than 88%, for example. The silica particles are spherical, for example. Silica particles having a particle size of not less than 20 μm and not more than 40 μm occupy not less than 30% and not more than 70% in volume ratio, and silica particles having a particle size of not less than 5 μm and less than 20 μm occupy not less than 30% and not more than 70% in volume ratio. Silica particles having a relatively large size and silica particles having a relatively small size are thus uniformly dispersed in the epoxy resin.

Figure 5:
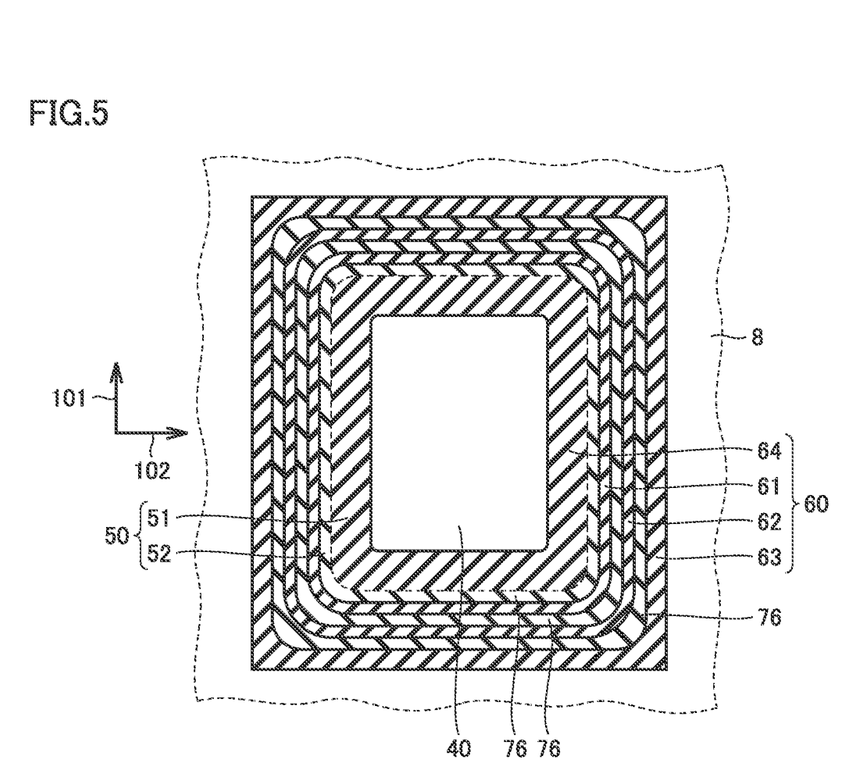
FIG. 5 is a schematic transverse sectional view taken along a line V-V in FIG. 4.

FIG. 5 is a schematic transverse sectional view taken along a line V-V in FIG. 4. As shown in FIG. 5, first insulating film 60 may include a first annular portion 61, a second annular portion 62, a third annular portion 63, and an inner peripheral region 64. Second annular portion 62 is spaced from first annular portion 61. Second annular portion 62 surrounds first annular portion 61. Second annular portion 62 is located closer to the outer periphery than first annular portion 61. Third annular portion 63 is spaced from each of first annular portion 61 and second annular portion 62. Third annular portion 63 surrounds second annular portion 62. Third annular portion 63 is located closer to the outer periphery than second annular portion 62. Third annular portion 63 forms second outer peripheral end portion 67. Inner peripheral region 64 is surrounded by first annular portion 61.

As shown in FIG. 4, second insulating film 70 includes a filling portion 76 and a body portion 75. Filling portion 76 is provided between first annular portion 61 and second annular portion 62. As shown in FIG. 5, filling portion 76 is located closer to the outer periphery than first annular portion 61 and closer to the inner periphery than second annular portion 62. Similarly, filling portion 76 is provided between second annular portion 62 and third annular portion 63. Filling portion 76 is located closer to the outer periphery than second annular portion 62 and closer to the inner periphery than third annular portion 63. Filling portion 76 is in contact with each of first annular portion 61, second annular portion 62 and third annular portion 63.

As shown in FIG. 4, filling portion 76 may be in contact with silicon carbide substrate 10. Filling portion 76 may be in contact with drift region 11 at first main surface 1. As shown in FIG. 4, inner peripheral region 64 of first insulating film 60 is in contact with each of the guard rings and drift region 11 at first main surface 1. Inner peripheral region 64 is located in first outer peripheral region portion 51. Filling portion 76 may be located in second outer peripheral region portion 52. First annular portion 61, second annular portion 62 and third annular portion 63 may each be located in second outer peripheral region portion 52. Filling portion 76 is located closer to the outer periphery than guard rings 16. Body portion 75 of second insulating film 70 is provided on each of filling portion 76 and first insulating film 60. First insulating film 60 has a thickness 111 of not less than 0.3 μm and not more than 3 μm, for example. Body portion 75 of second insulating film 70 has a thickness of not less than 3 μm and not more than 30 μm, for example, and more preferably not less than 5 μm and not more than 20 μm.

Figure 6:
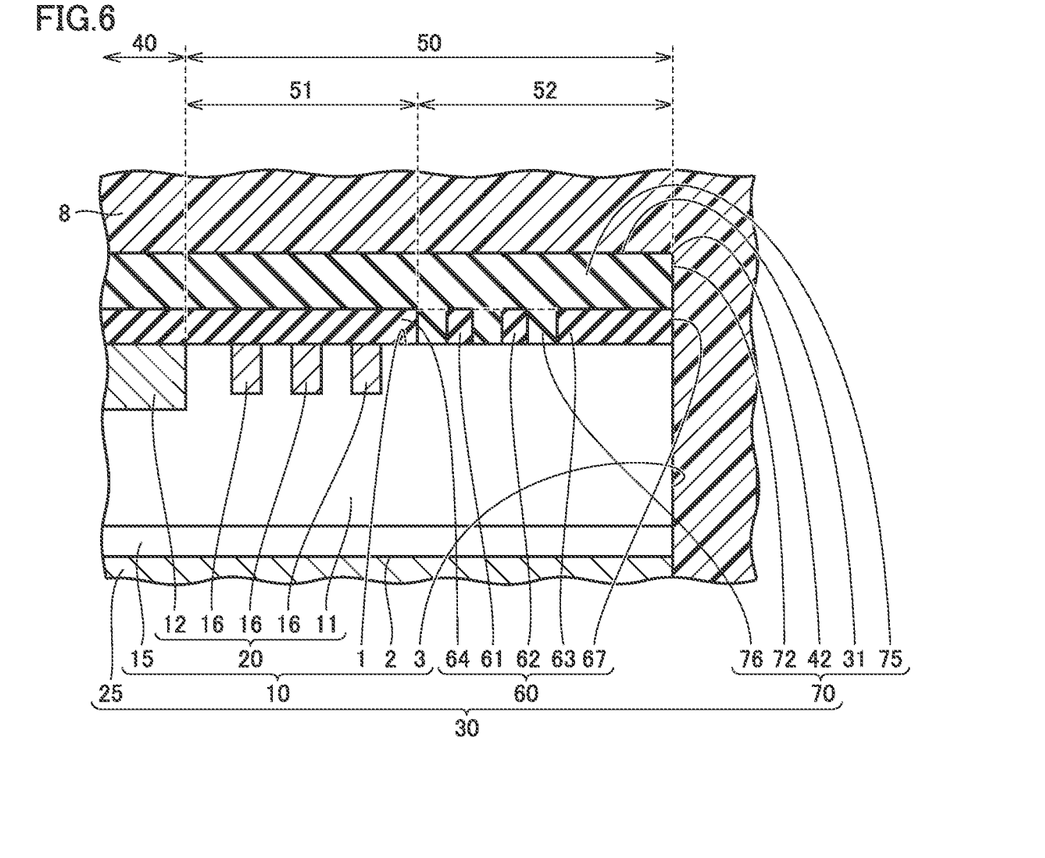
FIG. 6 is a schematic vertical sectional view taken along a line VI-VI in FIG. 2.

FIG. 6 is a schematic sectional view taken along a line VI-VI in FIG. 2. As shown in FIG. 2, line VI-VI is a straight line that perpendicularly bisects the long side of silicon carbide semiconductor chip 30 when viewed in the direction perpendicular to first main surface 1. As shown in FIG. 6, resin 8 is in contact with side region 42 of shoulder 71 (see FIG. 2). As shown in FIG. 4, in the cross section perpendicular to first main surface 1, corner region 41 of shoulder 71 is located on a straight line along outer peripheral surface 3. As shown in FIG. 6, in the cross section perpendicular to first main surface 1, side region 42 of shoulder 71 is located on the straight line along outer peripheral surface 3. From a different viewpoint, first outer peripheral end portion 72 of second insulating film 70 may be located along outer peripheral surface 3 around the entire third main surface 31.

Figure 7:
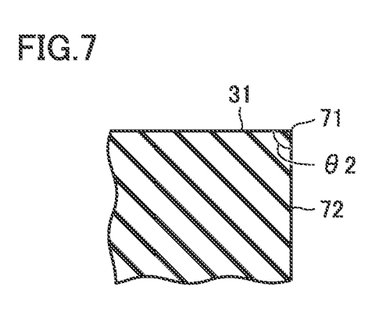
FIG. 7 is a schematic enlarged view of a region VII in FIG. 4.

FIG. 7 is a schematic enlarged view of a region VII in FIG. 6. As shown in FIG. 7, second insulating film 70 includes shoulder 71. Shoulder 71 is a boundary between first outer peripheral end portion 72 and third main surface 31. Shoulder 71 is continuous with each of first outer peripheral end portion 72 and third main surface 31. Shoulder 71 is angular, for example. Specifically, in the cross section shown in FIG. 7, first outer peripheral end portion 72 is linear. Similarly, in the cross section shown in FIG. 7, third main surface 31 is linear. An angle θ2 formed between third main surface 31 and first outer peripheral end portion 72 is 90°, for example. Angle θ2 may be not more than 90°. Resin 8 is in contact with angular shoulder 71. Resin 8 covers angular shoulder 71.

Figure 8:
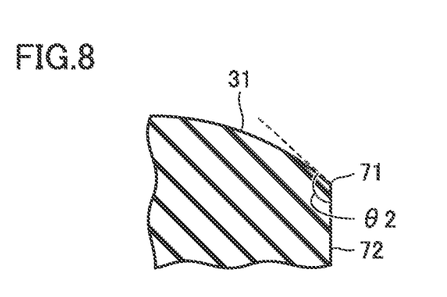
FIG. 8 is a schematic enlarged view showing a modification of FIG. 7.

Next, the configuration of a modification of silicon carbide semiconductor device 100 according to the present embodiment is described. FIG. 8 shows the configuration of a modification of FIG. 7.

In the cross section shown in FIG. 8, third main surface 31 is curved. In the cross section shown in FIG. 8, first outer peripheral end portion 72 is linear. Shoulder 71 is a boundary between curved third main surface 31 and linear first outer peripheral end portion 72. Angle θ2 formed between a tangent of third main surface 31 at shoulder 71 and first outer peripheral end portion 72 may be more than 90°. Angle θ2 may be 150°, for example. Even when third main surface 31 is a curve, shoulder 71 is formed angularly by first outer peripheral end portion 72 formed linearly. That is, angular shoulder 71 can be formed when at least one of third main surface 31 and first outer peripheral end portion 72 is linear.

Although silicon carbide semiconductor device 100 according to the present disclosure has been described above with reference to a MOSFET having a trench gate as an example, silicon carbide semiconductor device 100 according to the present disclosure is not limited as such. Silicon carbide semiconductor device 100 according to the present disclosure may be, for example, a planar MOSFET, an insulated gate bipolar transistor (IGBT), a Schottky barrier diode (SBD), a thyristor, a gate turn-off thyristor (GTO), or a PiN diode.

In addition, although n type has been described as the first conductivity type and p type has been described as the second conductivity type above, p type may be the first conductivity type and n type may be the second conductivity type. The concentration of a p type impurity and the concentration of an n type impurity in each impurity region described above can be measured, for example, with a scanning capacitance microscope (SCM) or secondary ion mass spectrometry (SIMS).

Next, functions and effects of silicon carbide semiconductor device 100 according to the present disclosure are described.

Generally, silicon carbide semiconductor chip 30 is covered with resin 8. Moisture that has entered resin 8 from an external environment expands under high temperature and forms a space inside. Stress is thereby applied to resin 8, resulting in the occurrence of a crack in resin 8. Subsequently, under low temperature, condensation occurs within the space, resulting in a reduced pressure in the space. Thus, moisture is drawn in from the external environment. Subsequently, under high temperature, the moisture expands to further enlarge the space. This results in extension of the crack formed in resin 8. When silicon carbide semiconductor device 100 is placed in an environment subjected to alternate repetition of high temperature and low temperature as described above, resin 8 on silicon carbide semiconductor chip 30 may be detached (popcorn phenomenon). In the above, the high temperature is 150° C., for example. The low temperature is −55° C., for example.

To suppress the detachment of resin 8, it may be contemplated to dispose a stress buffer layer such as polyimide between silicon carbide substrate 10 and resin 8. However, the stress buffer layer is much softer than silicon carbide substrate 10. Usually, when dividing a silicon carbide wafer into individual silicon carbide semiconductor chips 30, the silicon carbide wafer is diced with a blade having a hard material such as diamond as abrasive grains. Dicing of a soft material such as polyimide together with silicon carbide substrate 10, however, may cause clogging of the blade. For this reason, it has been conventionally difficult to form the stress buffer layer such as polyimide to extend to the outer peripheral end portion of silicon carbide semiconductor chip 30.

Hence, instead of the dicing with the blade having a hard material such as diamond as abrasive grains, it was determined to cut a silicon carbide wafer with laser. Specifically, pulse laser is applied along intended cut lines of the silicon carbide wafer. The pulse laser has a wavelength of 1064 nm, for example. A pulse width is 30 nanoseconds, for example. Pulse energy is 150 μJ, for example. A spot size is 5 μm, for example. The laser is in an unpolarized state (that is, an electric field vector of light is substantially uniformly distributed in every method), for example. Damage is thus inflicted along the intended cut lines of the silicon carbide wafer. Then, mechanical stress is applied to the silicon carbide wafer, to cut the silicon carbide wafer along the intended cut lines. The plurality of silicon carbide semiconductor chips 30 are thereby formed.

As described above, when laser cutting is used, the silicon carbide wafer does not need to be cut with a blade. Thus, polyimide can be formed on the intended cut lines of the silicon carbide wafer. As a result, an outer peripheral end portion (first outer peripheral end portion 72) of a stress buffer layer (second insulating film 70) can be provided at a position along outer peripheral surface 3 of silicon carbide substrate 10. The stress applied to resin 8 can thus be reduced as compared to when the outer peripheral end portion of the stress buffer layer is located closer to the inner periphery than the position along outer peripheral surface 3 of silicon carbide substrate 10. Therefore, the detachment of resin 8 can be suppressed.

In addition, in silicon carbide semiconductor device 100 according to the present embodiment, second insulating film 70 includes angular shoulder 71 continuous with first outer peripheral end portion 72. Resin 8 is in contact with angular shoulder 71. With shoulder 71 of second insulating film 70 formed angularly, the stress is actively concentrated on second insulating film 70. The stress applied to silicon carbide substrate 10 can thereby be reduced. Thus, the detachment of resin 8 from silicon carbide substrate 10 can be suppressed.

Furthermore, in silicon carbide semiconductor device 100 according to the present embodiment, first insulating film 60 includes first annular portion 61, and second annular portion 62 spaced from and surrounding first annular portion 61. Second insulating film 70 includes filling portion 76 provided between first annular portion 61 and second annular portion 62. The entry of moisture into silicon carbide semiconductor chip 30 can thereby be suppressed.

EXAMPLE (Preparation of Samples)

Experiments to confirm the effect of suppressing the detachment of resin were conducted using the following samples. A longitudinal dimension×a lateral dimension of a chip size and dimensions of a mount surface of a mount copper frame in the samples are described. A first sample had a chip size of 3 mm×3 mm, and dimensions of 14 mm×9.5 mm of the mount surface of the mount copper frame. A second sample had a chip size of 3 mm×3 mm, and dimensions of 17 mm×10 mm of the mount surface of the mount copper frame. A third sample had a chip size of 6 mm×6 mm, and dimensions of 14 mm×9.5 mm of the mount surface of the mount copper frame. A fourth sample had a chip size of 6 mm×6 mm, and dimensions of 17 mm×10 mm of the mount surface of the mount copper frame. The chip had a thickness between 150 μm and 200 μm. Two standards were prepared for each of these samples, in which polyimide was provided between silicon carbide substrate 10 and resin 8 as in the embodiment (the structure shown in FIG. 4), and in which polyimide was not provided between silicon carbide substrate 10 and resin 8.

Note that the relation between the chip size and the dimensions of the mount surface of the mount copper frame is not limited to the examples above. That is, other relations than those of the samples are applicable so long as the chip size is smaller than the dimensions of the mount surface of the mount copper frame. For example, when the chip size is 3 mm×3 mm, the dimensions of the mount surface of the mount copper frame may be 20 mm×14 mm. When the chip size is 5 mm×6 mm, the dimensions of the mount surface of the mount copper frame may be 14 mm×9.5 mm, or 17 mm×10 mm, or 20 mm×14 mm. When the chip size is 6 mm×6 mm, the dimensions of the mount surface of the mount copper frame may be 20 mm×14 mm. When the chip size is 10 mm×12 mm, the dimensions of the mount surface of the mount copper frame may be 20 mm×14 mm. When the chip size is 12 mm×12 mm, the dimensions of the mount surface of the mount copper frame may be 20 mm×14 mm.

(Experiment Method)

The presence or absence of detachment of resin can be confirmed by observing, using an ultrasonic microscope with an ultrasonic probe, conditions before and after a cycle test in an environment subjected to alternate repetition of high temperature and low temperature. The presence or absence of occurrence of detachment can be determined by observing an adhesive state between the resin and a chip upper surface, and between the resin and a frame surface. First, a temperature cycle between a high temperature side (150° C.) and a low temperature side (−55° C.) is repeated 1000 times, more desirably 5000 times. Then, the presence or absence of occurrence of detachment is determined based on analysis of reflection and transmission of ultrasound. The occurrence of detachment having a lateral dimension of about 100 μm is used as a criterion for pass/fail determination.

Micro detachment that cannot be observed with an ultrasonic microscope can be detected with the following method. First, a high-temperature and high-humidity test (for example, temperature: 85° C.; humidity: 85%) is conducted during or after the cycle test. When the resin is detached or includes a crack, moisture enters the resin, resulting in malfunction of the chip. By detecting the malfunction of the chip, the presence or absence of detachment of or a crack in the resin is indirectly determined.

(Experiment Results)

In samples in which the measures for suppressing the detachment were not taken, the detachment occurred within less than 1000 temperature cycles, and malfunction also occurred in the high-temperature and high-humidity test after the cycle test. In particular, a feature was confirmed in which the detachment occurred at a corner of the chip within less than 500 temperature cycles. In samples in which the measures for suppressing the detachment were taken, on the other hand, the detachment did not occur at a corner and a side portion of the chip even after 1000 temperature cycles, and satisfactory operation was also confirmed in the high-temperature and high-humidity test after the cycle test. Similar effect was also confirmed after a cycle test between a more stringent high temperature side (175° C.) and a low temperature side (−55° C.) that had been conducted 5000 times, and the high-temperature and high-humidity test after the cycle test.

In samples in which the measures for suppressing the detachment were not taken, it was confirmed that the detachment tended to occur sooner in the cycle test as the chip size increased, and as the dimensions of the mount surface decreased. It was also confirmed that the detachment tended to occur sooner as a ratio between the chip size and the mount surface increased (in the present case, the ratio of chip area/mount surface area was a minimum of 3% and a maximum of 51%). In samples of the example in which the measures for suppressing the detachment were taken, it was confirmed that the detachment of the resin did not occur in the cycle test that had been conducted 5000 times, and in the high-temperature and high-humidity test after the cycle test, with every chip size and every dimension of the mount surface described above.

It should be understood that the embodiment disclosed herein is illustrative and non-restrictive in every respect. The scope of the present invention is defined by the terms of the claims rather than the description above, and is intended to include any modifications within the meaning and scope equivalent to the terms of the claims.

REFERENCE SIGNS LIST

1: first main surface; 2: second main surface; 3: outer peripheral surface; 8: resin; 9: gate trench; 10: silicon carbide substrate; 11: drift region; 12: body region; 13: source region; 14: contact region; 15: silicon carbide single-crystal substrate; 16: guard ring; 20: silicon carbide epitaxial layer; 21: contact electrode; 22: gate electrode; 23: interlayer insulating film; 24: gate insulating film; 25: drain electrode; 28: source electrode; 29: source wire; 30: silicon carbide semiconductor chip; 31: third main surface; 32: fourth main surface; 40: active region; 41: corner region; 42: side region; 50: outer peripheral region; 51: first outer peripheral region portion; 52: second outer peripheral region portion; 60: first insulating film; 61: first annular portion; 62: second annular portion; 63: third annular portion; 64: inner peripheral region; 67: second outer peripheral end portion; 70: second insulating film; 71: shoulder; 72: first outer peripheral end portion; 73: solder layer; 74: metal frame; 75: body portion; 76: filling portion; 90: silicon carbide semiconductor element; 91: sidewall surface; 92: bottom; 100: silicon carbide semiconductor device; 101: first direction; 102: second direction.

The invention claimed is:

1. A silicon carbide semiconductor device comprising:
a silicon carbide semiconductor chip; and
a resin covering the silicon carbide semiconductor chip, wherein
the silicon carbide semiconductor chip includes a silicon carbide substrate, a first insulating film on the silicon carbide substrate, and a second insulating film on the first insulating film,
the silicon carbide substrate has a first main surface in contact with the first insulating film, a second main surface opposite to the first main surface, and an outer peripheral surface continuous with each of the first main surface and the second main surface,
the resin covers both of the outer peripheral surface and the second insulating film,
the second insulating film has a Young's modulus lower than that of the resin,
the second insulating film has a thermal expansion coefficient higher than that of the silicon carbide substrate and higher than that of the resin,
the second insulating film includes a first outer peripheral end portion in a direction parallel to the first main surface, and
in a cross section perpendicular to the first main surface, the first outer peripheral end portion is provided along the outer peripheral surface,
wherein the first insulating film includes a first annular portion, and a second annular portion spaced from and surrounding the first annular portion.

2. The silicon carbide semiconductor device according to claim 1, wherein
the second insulating film includes an angular shoulder continuous with the first outer peripheral end portion, and
the resin is in contact with the shoulder.

3. The silicon carbide semiconductor device according to claim 1, wherein
the first insulating film includes a second outer peripheral end portion in the direction parallel to the first main surface, and
in the cross section perpendicular to the first main surface, the second outer peripheral end portion is provided along the outer peripheral surface.

4. The silicon carbide semiconductor device according to claim 1, wherein
the second insulating film includes a filling portion provided between the first annular portion and the second annular portion, and
the filling portion is in contact with the silicon carbide substrate.

5. A silicon carbide semiconductor device comprising:
a silicon carbide semiconductor chip; and
a resin covering the silicon carbide semiconductor chip, wherein
the silicon carbide semiconductor chip includes a silicon carbide substrate, a first insulating film on the silicon carbide substrate, and a second insulating film on the first insulating film,
the silicon carbide substrate has a first main surface in contact with the first insulating film, a second main surface opposite to the first main surface, and an outer peripheral surface continuous with each of the first main surface and the second main surface,
the resin covers both of the outer peripheral surface and the second insulating film,
the second insulating film has a Young's modulus lower than that of the resin,
the second insulating film has a thermal expansion coefficient higher than that of the silicon carbide substrate and higher than that of the resin,
the second insulating film includes a first outer peripheral end portion in a direction parallel to the first main surface, and an angular shoulder continuous with the first outer peripheral end portion,
in a cross section perpendicular to the first main surface, the first outer peripheral end portion is provided along the outer peripheral surface,
the resin is in contact with the shoulder,
the first insulating film includes a second outer peripheral end portion in the direction parallel to the first main surface,
in the cross section perpendicular to the first main surface, the second outer peripheral end portion is provided along the outer peripheral surface,
the first insulating film includes a first annular portion, and a second annular portion spaced from and surrounding the first annular portion,
the second insulating film includes a filling portion provided between the first annular portion and the second annular portion, and
the filling portion is in contact with the silicon carbide substrate.

* * * * *